United States Patent [19]
Tanabe

[11] Patent Number: 5,777,525
[45] Date of Patent: *Jul. 7, 1998

[54] OSCILLATING APPARATUS HAVING VARIABLY CONTROLLED VIBRATION CANCELLATION

[75] Inventor: Shinji Tanabe, Tokyo, Japan

[73] Assignee: NEC Corporation, Tokyo, Japan

[*] Notice: The term of this patent shall not extend beyond the expiration date of Pat. No. 5,659,271.

[21] Appl. No.: 762,945

[22] Filed: Dec. 10, 1996

Related U.S. Application Data

[63] Continuation of Ser. No. 363,943, Dec. 27, 1994, Pat. No. 5,659,271.

[30] Foreign Application Priority Data

Dec. 24, 1993 [JP] Japan ................................. 5-327032

[51] Int. Cl.$^6$ .................................................. H03B 5/04
[52] U.S. Cl. ........................... 331/158; 331/10; 331/175
[58] Field of Search ............................. 331/158, 175, 331/65, 116 R, 116 FE, 10

[56] References Cited

U.S. PATENT DOCUMENTS 4,318,063  3/1982  Przyjemski ........................ 331/158
4,453,141  6/1984  Rosati ............................... 331/158
4,891,611  1/1990  Frerking ............................ 331/158

FOREIGN PATENT DOCUMENTS 2-108429  8/1990  Japan.

*Primary Examiner*—Robert Pascal
*Assistant Examiner*—David H Vu
*Attorney, Agent, or Firm*—Sughrue, Mion, Zinn, Macpeak & Seas, PLLC

[57] ABSTRACT

An oscillating apparatus includes a quartz crystal oscillator for outputting a reference frequency signal; a phase-locked loop for oscillating a desired frequency signal on the basis of an output from the quartz crystal oscillator, a unit for detecting vibration components added to the quartz crystal oscillator, a unit for variably controlling phases and levels of the detected vibration components, a unit for obtaining a correlation value between the detected vibration components and vibration components in the phase-locked loop to variably control the phases and the levels, and a unit for controlling the phase-locked loop on the basis of the phases and levels of the vibration components which are variably controlled.

3 Claims, 3 Drawing Sheets

1
OSCILLATING APPARATUS HAVING VARIABLY CONTROLLED VIBRATION CANCELLATION

This is a Continuation of application Ser. No. 08/363,943 filed Dec. 27, 1994, now U.S. Pat. No. 5,659,271.

BACKGROUND OF THE INVENTION

1. Field of the Invention

The present invention relates to a communication apparatus used in mobile communication and, more particularly, to an oscillating apparatus which prevents a degradation in phase noise characteristics due to vibrations.

2. Description of the Prior Art

Various physical countermeasures are applied to a conventional oscillator used as the local oscillating circuit of a communication apparatus to prevent a degradation in phase noise characteristics due to vibrations. For example, an oscillator used when a station is stationary employs a structure in which a vibration element is fixed with an adhesive having a small elastic coefficient. An oscillator used in a mobile station adopts a structure in which a vibration element is supported by springs.

FIG. 1 is a view showing the former case which is disclosed in Japanese Unexamined Utility Model Publication No. 2-108429. A crystal resonator 61 is sealed in a holder 62 and mounted on a print board 64 having thin annealed copper wires 66 connected to electrode lead wires 63 of the holder 62. The holder 62 is fixed to the print board 64 with an adhesive 65 having a small elastic coefficient. With this structure, mechanical vibrations added to the print board 64 are hardly transmitted to the crystal resonator 61.

FIG. 2 is a view showing the latter case. A crystal resonator 71 is supported by eight springs 72 in a holder 73. Mechanical vibrations added to the holder 73 are absorbed by the springs 72, thereby preventing transmission of the vibrations to the crystal resonator 71.

Of the above-described conventional countermeasures against vibrations, the former is limited in reduction of the elastic coefficient of the adhesive. For this reason, it is difficult to effectively prevent transmission of vibrations from the print board 64 to the quartz crystal oscillator 61, and a large improvement effect can hardly be expected. The latter can obtain a larger improvement effect by appropriately setting the spring constant of the springs 72. However, when the entire structure becomes bulky, the improvement amount receives influences of the mounting method and varies. Depending on the set value of the spring constant, the effect varies in accordance with a vibration frequency. Especially, when the springs are resonant with vibrations, a greater degradation may be undesirably caused.

SUMMARY OF THE INVENTION

It is an object of the present invention to provide an oscillating apparatus capable of largely improving a degradation in phase noise characteristics due to vibrations.

In order to achieve the above object, according to the first aspect of the present invention, there is provided an oscillating apparatus comprising a quartz crystal oscillator for outputting a reference frequency signal, a phase-locked loop for oscillating a desired frequency signal on the basis of an output of the quartz crystal oscillator, means for detecting vibration components added to the quartz crystal oscillator, means for variably controlling phases and levels of the detected vibration components, means for obtaining a correlation value between the detected vibration components and vibration components in the phase-locked loop to variably control the phases and the levels, and means for controlling the phase-locked loop on the basis of the phases and levels of the vibration components which are variably controlled.

According to the second aspect of the present invention, there is provided an oscillating apparatus comprising a quartz crystal oscillator for outputting a reference frequency, a voltage-controlled oscillator whose output frequency is controlled on the basis of a received control voltage, a phase comparator for comparing phases of outputs from the quartz crystal oscillator and the voltage-controlled oscillator with each other, a subtracter connected to an output terminal of the phase comparator, a loop amplifier for supplying an output of the subtracter as the control voltage to the voltage-controlled oscillator, a vibration sensor for detecting vibration components added to the quartz crystal oscillator, a multiplier for variably controlling a phase and level of an output of the vibration sensor, and a correlator for obtaining a correlation value between the vibration components of the outputs of the vibration sensor and the subtracter to control the multiplier, the subtracter subtracting an output of the multiplier from an output of the phase comparator.

According to the third aspect of the present invention, there is provided an oscillating apparatus in which the vibration sensor according to the second aspect has an X-axis acceleration sensor, a Y-axis acceleration sensor, and a Z-axis acceleration sensor for detecting X-, Y-, and Z-axis accelerations of the quartz crystal oscillator, respectively, and further comprising X-, Y-, and Z-axis dividers for dividing the vibration components detected by the sensors, X-, Y-, and Z-axis multipliers for variably controlling a phase and level of one output of each of the dividers, an adder for adding outputs of the multipliers, the subtracter for subtracting an output of the adder from the output of the phase comparator, a divider for dividing the output of the subtracter and outputting one of the divided outputs to the loop amplifier, a three-directional divider for dividing the other output of each of the dividers in three directions, and X-, Y-, and Z-axis correlators for obtaining correlation values between the vibration components of outputs of the three-directional divider and the outputs of the X-, Y-, and Z-axis dividers, respectively, the X-, Y-, and Z-axis multipliers being controlled in accordance with the correlation values.

In the oscillating apparatus of the present invention, an oscillation signal from a quartz crystal oscillator for outputting a reference frequency signal and an oscillation signal from a voltage-controlled oscillator as one constituent element of a phase-locked loop are simultaneously input to a phase comparator. A phase difference signal between the two oscillation signals is output from the comparator to a subtracter. An output from the subtracter is input to a divider. One output from the divider is input to a voltage-controlled oscillator as a control voltage through a loop amplifier, and the other is input to a three-directional divider. On the other hand, a vibration component in at least one direction of the X-, Y-, and Z-axis directions of the quartz crystal oscillator is input to another divider. One output of the divider is input to a multiplier, and the other is input to a correlator. Since an output from the three-directional divider is also input to the correlator, a correlation value between the vibration components in the phase-locked loop and the vibration components in the quartz crystal oscillator can be obtained by the correlator. The level and phase of the vibration components in the quartz crystal oscillator, which are input to the multiplier through the divider, are variably controlled in accordance with the correlation value. The vibration components in the quartz crystal oscillator, which are controlled in the above-described manner, are added by an adder. The sum value is subtracted from the phase difference signal input from the phase comparator by the subtracter. In this manner, the control voltage output from the loop amplifier and input to the voltage-controlled oscillator cancels variations in output from the phase comparator, which are caused due to vibrations in the quartz crystal oscillator. Therefore, a degradation in phase noise characteristics due to vibrations in the quartz crystal oscillator can be effectively prevented.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENT

Figure 1:
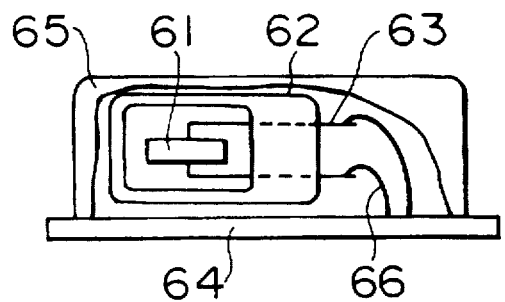
FIG. 1 is a partially sectional side view schematically showing the internal structure of a conventional quartz crystal oscillator to which countermeasures against vibrations are applied.
Figure 2:
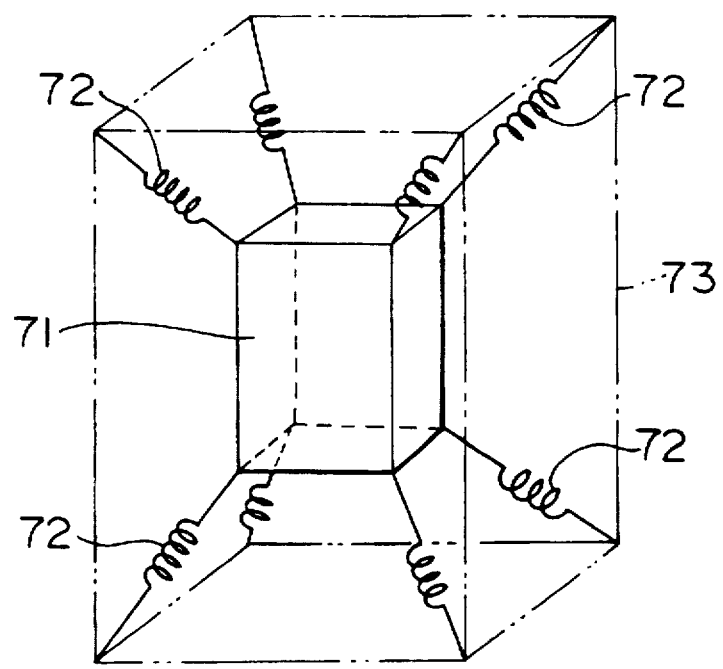
FIG. 2 is a perspective view schematically showing the internal structure of another conventional quartz crystal oscillator to which countermeasures against vibrations are applied.
Figure 3:
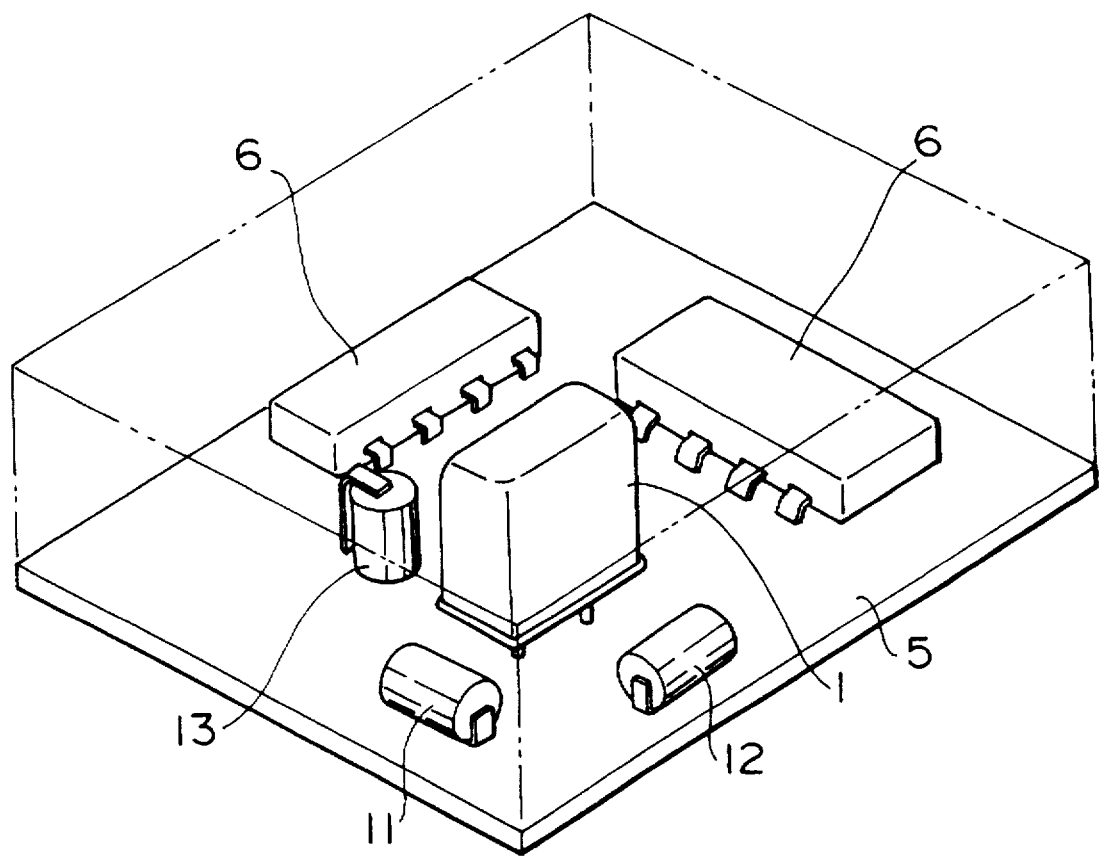
FIG. 3 is a perspective view schematically showing the structure of an oscillating apparatus according to an embodiment of the present invention.
Figure 4:
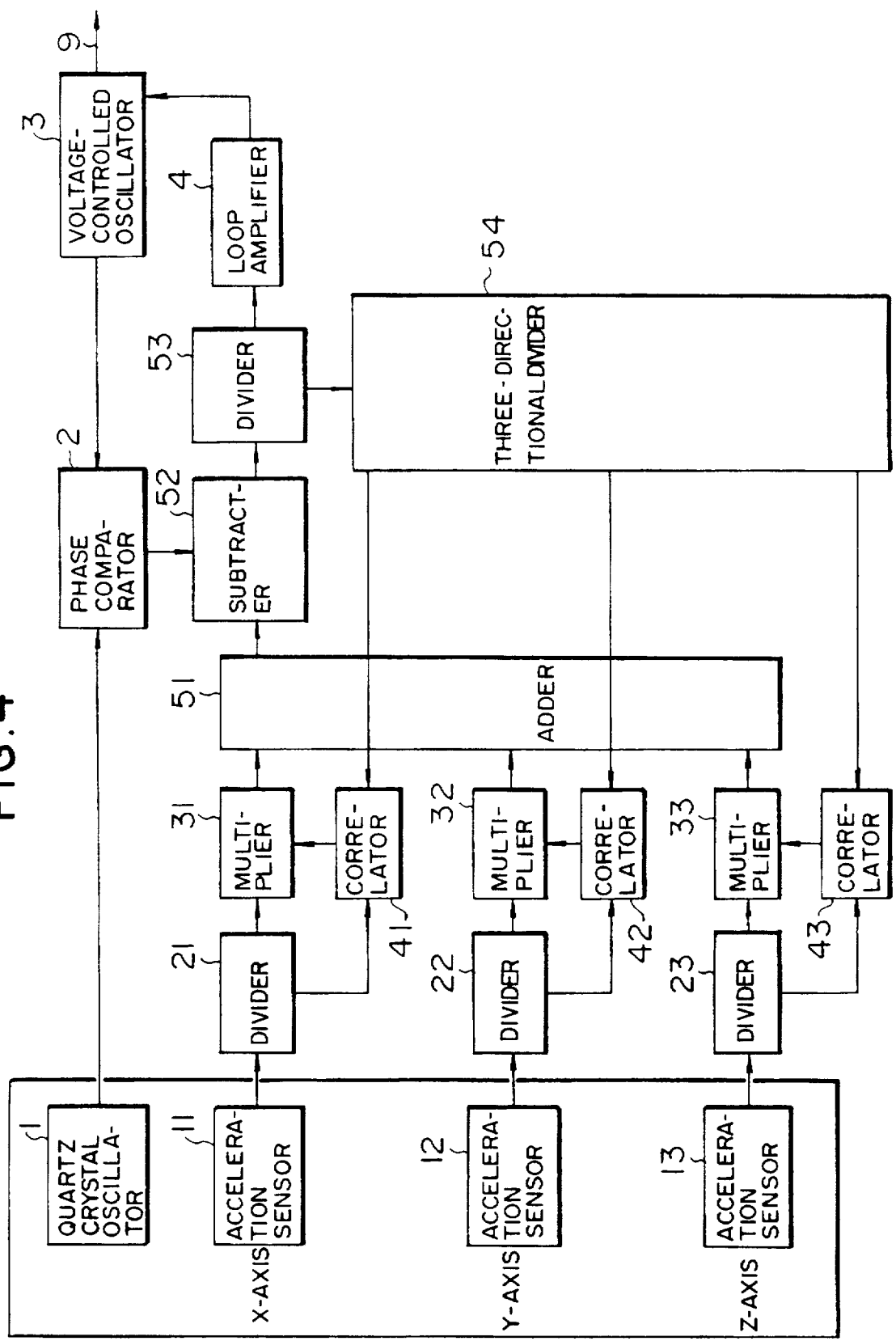
FIG. 4 is a block diagram showing the entire arrangement of the oscillating apparatus according to an embodiment of the present invention.

The present invention will be described below with reference to an embodiment shown in the accompanying drawings (FIGS. 3 and 4).

FIG. 3 is a perspective view schematically showing the structure of an embodiment of the present invention. Referring to FIG. 3, a quartz crystal oscillator 1 for outputting a reference frequency signal has a structure in which a crystal oscillator is sealed in an airtight casing, and is mounted on a circuit board 5 constituting an oscillating apparatus. An X-axis acceleration sensor 11, a Y-axis acceleration sensor 12, and a Z-axis acceleration sensor 13, all of which serve as vibration sensors, are integrally fixed on the circuit board 5 at positions near the quartz crystal oscillator 1. The X-, Y-, and Z-axis acceleration sensor 11 to 13 are constituted by, e.g., cylindrical piezoelectric elements. The detecting directions are set along the X-, Y-, and Z- axes of the circuit board 5, i.e., along the X-, Y-, and Z- axes of the quartz crystal oscillator 1. With this arrangement, the acceleration sensors 11 to 13 respectively detect X-, Y-, and Z-axis vibration components added to the quartz crystal oscillator 1, thereby outputting voltage waveforms corresponding to the detected vibration components. Additionally, various electronic circuit components 6 constituting circuits (to be described later) are mounted on the circuit board 5.

FIG. 4 is a block diagram of the oscillating apparatus constituted by the quartz crystal oscillator 1 and the X-, Y-, and Z-axis acceleration sensors 11 to 13. A phase comparator 2 is connected to the output terminal of the quartz crystal oscillator 1. A reference frequency signal oscillated by the quartz crystal oscillator 1 is input to one input terminal of the phase comparator 2. The other input terminal of the phase comparator 2 receives an output signal from a voltage-controlled oscillator 3 whose oscillation frequency is changed in accordance with the magnitude of a control voltage applied to its control voltage input terminal. A phase difference signal between the two signals is output to a subtracter 52. An output of the subtracter 52 is input to a divider 53. One output of the divider 53 is input to the control voltage input terminal of the voltage-controlled oscillator 3 as a control voltage through a loop amplifier 4. With this operation, a phase-locked loop is constituted using an output from the quartz crystal oscillator 1 as a reference frequency signal. The other output of the divider 53 is input to a three-directional divider 54.

A divider 21 is connected to the output terminal of the X-axis acceleration sensor 11. A multiplier 31 is connected to one output terminal of the divider 21. An output from the multiplier 31 is input to an adder 51. The X-axis acceleration sensor 11 detects an X-axis vibration component in the quartz crystal oscillator 1. The level (amplitude) and phase of the X-axis vibration component are variably controlled by the multiplier 31. A correlator 41 connected to the other output terminal of the divider 21 is also connected to the first output terminal of the three-directional divider 54. Therefore, a correlation value between an output of the divider 21 and the first output of the three-directional divider 54 is obtained by the correlator 41. The multiplier 31 is controlled in accordance with the correlation value. The multiplier 31 and the correlator 41 are constituted to reduce the vibration component of the output of the subtracter 52.

A Y-axis vibration component in the quartz crystal oscillator 1 is detected by the acceleration sensor 12. The detection output is divided by a divider 22. One output of the divider 22 is input to a multiplier 32. The level (amplitude) and phase of the Y-axis vibration component are variably controlled by the multiplier 32. A correlator 42 connected to the other output terminal of the divider 22 also receives the second output from the three-directional divider 54. Therefore, a correlation value between an output of the divider 22 and the second output of the three-directional divider 54 is obtained by the correlator 42. The multiplier 32 is controlled in accordance with the correlation value. The multiplier 32 and the correlator 42 are constituted to reduce the vibration component of the output from the subtracter 52.

A Z-axis vibration component in the quartz crystal oscillator 1 is detected by the acceleration sensor 13. The detection output is divided by a divider 23. One output of the divider 23 is input to a multiplier 33. The level (amplitude) and phase of the Z-axis vibration component are variably controlled by the multiplier 33. A correlator 43 connected to the other output terminal of the divider 23 also receives the third output of the three-directional divider 54. Therefore, a correlation value between an output of the divider 23 and the third output of the three-directional divider 54 is obtained by the correlator 43. The multiplier 33 is controlled in accordance with the correlation value. The multiplier 33 and the correlator 43 are constituted to reduce the vibration component of the output from the subtracter 52.

Outputs from the X-, Y-, and Z-axis multipliers 31 to 33 are input to the adder 51, and the levels of the X-, Y-, and Z-axis outputs are added by the adder 51. The sum signal is input to the subtracter 52 and subtracted from the output signal (phase difference signal) from the phase comparator 2 in the phase-locked loop.

With this arrangement, as in the prior art, in the phase-locked loop constituted by the quartz crystal oscillator 1, the phase comparator 2, the voltage-controlled oscillator 3, and the loop amplifier 4, the voltage-controlled oscillator 3 oscillates at a frequency based on the reference frequency signal oscillated by the quartz crystal oscillator 1, and a portion of an output from the voltage-controlled oscillator 3 is output from an output terminal 9.

If vibrations are added to the quartz crystal oscillator 1, the X-, Y-, and Z-axis vibration components are respectively detected by the acceleration sensors 11 to 13. The levels and phases of the detected vibration components are variably controlled by the multipliers 31 to 33. This is because correlation values between the detected vibration components and the vibration components in the phase-locked loop are obtained by the correlators 41 to 43, and the multipliers 31 to 33 are controlled in accordance with the correlation values. The X-, Y-, and Z-axis components whose levels and phases are variably controlled are added by the adder 51. The sum value is subtracted from the output signal (phase difference signal) from the phase comparator 2 by the subtracter 52 in the phase-locked loop.

With this operation, a feedback is formed such that the vibration components generated in the quartz crystal oscillator 1 are canceled by the vibration components detected by the acceleration sensors 11 to 13, thereby reducing the vibration components in the phase-locked loop. For this reason, the control voltage output from the loop amplifier 4 and input to the voltage-controlled oscillator 3 cancels variations in output of the subtracter 52, which are caused due to vibrations in the quartz crystal oscillator 1. When the voltage-controlled oscillator 3 oscillates on the basis of this corrected control voltage, a degradation in phase noise characteristics due to the vibrations in the quartz crystal oscillator 1 can be effectively prevented.

In this oscillating apparatus, a degradation in phase noise characteristics due to vibrations is prevented by an electrical means. With the conventional mechanical means, the improvement amount varies, or an increase in response magnification during resonance results in an increase in the degree of degradation as compared to an apparatus with no countermeasure. However, the oscillating apparatus of the present invention can effectively achieve an improvement for degradation in phase noise characteristics without posing the conventional problems.

In the above embodiment, vibrations added to the quartz crystal oscillator are detected by the acceleration sensors as X-, Y-, and Z-axis components. However, in accordance with the precision desired for the oscillating apparatus, only a vibration component in one axial direction or two axial directions may be detected to control the phase-locked loop.

The acceleration sensors may be arranged in a vehicle or other equipments loading a communication apparatus. However, to precisely detect the vibration components added to the quartz crystal oscillator, the acceleration sensors are preferably arranged integrally with the quartz crystal oscillator.

The vibration sensor of the present invention is not limited to the acceleration sensor constituted by a piezoelectric element, and a sensor constituted by another element may also be used.

As has been described above, according to the present invention, the vibration sensors for detecting the vibration components added to the quartz crystal oscillator are provided. The feedback is formed such that the vibration components in the phase-locked loop are reduced on the basis of the vibration components detected by the vibration sensors. The vibration components in the phase-locked loop are variably controlled rising an output from the quartz crystal oscillator as a reference frequency signal. Therefore, variations in level or phase due to the vibrations in the quartz crystal oscillator can be effectively canceled in the phase-locked loop, thereby largely improving a degradation in phase noise characteristics.

What is claimed is:

1. An oscillating apparatus comprising:
   a circuit board,
   a quartz crystal oscillator, mounted on the circuit board, for outputting a reference frequence signal,
   a voltage controlled oscillator,
   a phase-locked loop coupling said quartz crystal oscillator and said voltage controlled oscillator,
   vibration sensor means mounted on said circuit board for detecting vibration components added to said quartz crystal oscillator,
   multiplier means for variably controlling phases and levels of the detected vibration components,
   correlator means for obtaining a correlation value between the detected vibration components and vibration components in said phase-locked loop to provide a control signal to the multiplier means, and
   means for controlling said phase-locked loop on the basis of the output of said multiplier means.

2. The Oscillating apparatus of claim 1, further comprising a three-directional divider coupled between said phase-locked loop and said correlator means.

3. The oscillating apparatus of claim 1, wherein said vibration sensor means comprises three accelerometers mounted on the circuit board at mutually perpendicular axis directions.

* * * * *